United States Patent
Tseng et al.

(10) Patent No.: US 9,434,076 B2
(45) Date of Patent: Sep. 6, 2016

(54) ROBOT BLADE DESIGN

(71) Applicant: Taiwan Semiconductor Manufacturing Co., Ltd., Hsin-Chu (TW)

(72) Inventors: Lee-Chuan Tseng, New Taipei (TW); Chih-Jen Chan, Changhua (TW); Shih-Wei Lin, Taipei (TW); Che-Ming Chang, Longtan Township (TW); Chung-Yen Chou, Hsinchu (TW); Yuan-Chih Hsieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 346 days.

(21) Appl. No.: 13/959,851

(22) Filed: Aug. 6, 2013

(65) Prior Publication Data
US 2015/0044008 A1 Feb. 12, 2015

(51) Int. Cl.
*B25J 11/00* (2006.01)
*B25J 15/00* (2006.01)
*H01L 21/677* (2006.01)
*H01L 21/687* (2006.01)

(52) U.S. Cl.
CPC ......... *B25J 11/0095* (2013.01); *B25J 15/0014* (2013.01); *H01L 21/67766* (2013.01); *H01L 21/68707* (2013.01)

(58) Field of Classification Search
CPC ............. B25J 11/0095; B25J 15/0014; H01L 21/68707; H01L 21/67766
See application file for complete search history.

(56) References Cited

U.S. PATENT DOCUMENTS

| | | | | |
|---|---|---|---|---|
| 6,113,982 A * | 9/2000 | Claar | .................... | C04B 35/652 427/248.1 |
| 6,712,579 B2 * | 3/2004 | Fujii | ................. | H01L 21/68707 414/226.04 |
| 6,729,834 B1 * | 5/2004 | McKinley | ........... | H01L 21/6835 414/222.01 |
| 6,808,589 B2 | 10/2004 | Su et al. | | |
| 7,048,316 B1 * | 5/2006 | Blank | ............... | H01L 21/67748 294/213 |
| 8,100,451 B2 * | 1/2012 | Okuda | .................... | A61F 2/583 294/106 |
| 2008/0181842 A1 * | 7/2008 | Sethi | .................... | B01J 19/0093 423/588 |
| 2009/0003973 A1 | 1/2009 | Choi et al. | | |
| 2010/0275636 A1 * | 11/2010 | Yoshimura | ........... | A01N 1/0263 62/374 |

* cited by examiner

*Primary Examiner* — Scott Lowe
(74) *Attorney, Agent, or Firm* — Eschweiler & Associates, LLC

(57) ABSTRACT

The present disclosure relates to a wafer transfer robot having a robot blade that can be used to handle substrates that are patterned on both sides without causing warpage of the substrates. In some embodiments, the wafer transfer robot has a robot blade coupled to a transfer arm that varies a position of the robot blade. The robot blade has a wafer reception area that receives a substrate. Two or more spatially distinct contact points are located at positions along a perimeter of the wafer reception area that provide support to opposing edges of the substrate. The two or more contact points are separated by a cavity in the robot blade. The cavity mitigates contact between a backside of the substrate and the robot blade, while providing support to opposing sides of the substrate to prevent warpage of the substrate.

20 Claims, 4 Drawing Sheets

ROBOT BLADE DESIGN

BACKGROUND

Integrated chips are formed by complex fabrication processes that operate upon a semiconductor substrate with a plurality of steps performed by different processing tools. During such fabrication processes, contact between an integrated chip and the outside world is minimized to reduce contaminants that come into contact with the integrated chip and to thereby improve yield.

For example, integrated chips are fabricated in clean rooms that have low levels of contaminant particles (e.g., dust) that could be harmful to an integrated chip. Similarly, human contact with an integrated chip is minimized during fabrication processes by using wafer transfer robots to transfer semiconductor substrates from one location to another (e.g., between a wafer cassette and a processing tool, or vice versa).

DETAILED DESCRIPTION

Figure 1:
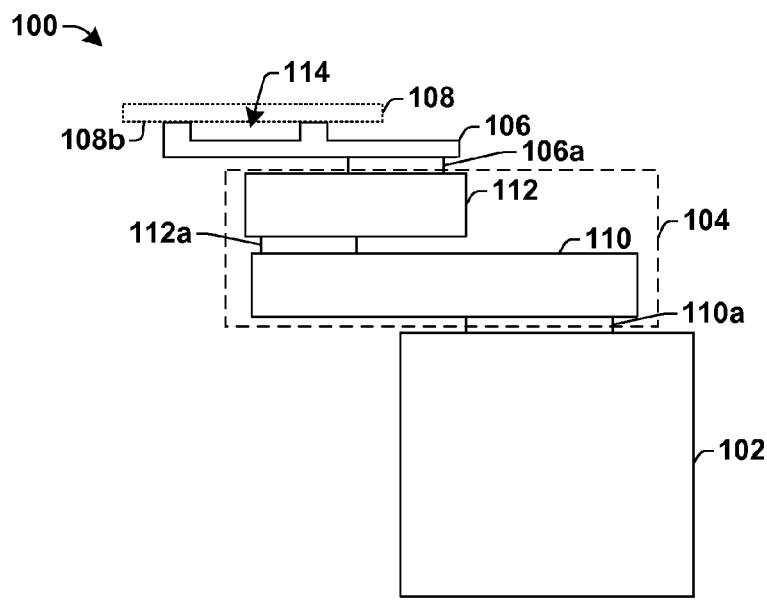
FIG. 1 illustrates a cross-sectional view of some embodiments of a wafer transfer robot having a disclosed robot blade.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Wafer transfer robots comprise robot blades configured to handle semiconductor substrates during transportation between a first location and a second location. The robot blades often comprise a wafer reception area having a flat surface upon which a semiconductor substrate rests. However, some semiconductor substrates comprising MEMs (Microelectromechanical systems) have patterns on both sides of the substrate, therefore causing the robot blades to be brought into contact with the pattern on the substrate. Contact between the robot blade and the pattern can damage the substrate and reduce yield. Alternatively, damage to patterns on an underside of the substrate may be avoided by using a robot blade to hold a substrate at a single side of the substrate. However, such robot blades will bend thin substrates (e.g., a substrate having a thickness of less than or equal to 375 um), resulting in undesirable warpage (e.g., in excess of 1.2 mm) of the substrate.

Accordingly, the present disclosure relates to a wafer transfer robot comprising a robot blade that can be used to handle substrates that are patterned on both sides without causing warpage of the substrates. In some embodiments, the wafer transfer robot comprises a robot blade coupled to a transfer arm configured to vary a position of the robot blade. The robot blade comprises a wafer reception area configured to receive a substrate. Two or more spatially distinct contact points, on an exposed surface of the robot blade, are located at positions along a perimeter of the wafer reception area that provide support to opposing edges of the substrate. The two or more contact points are separated by a cavity comprising a depression in the exposed surface. The cavity mitigates contact between a backside of the substrate and the robot blade, while providing support to opposing sides of the substrate to prevent warpage of the substrate.

FIG. 1 illustrates a cross-sectional view of some embodiments of a wafer transfer robot 100 having a disclosed robot blade 106.

The wafer transfer robot 100 comprises a base 102 connected to a transfer arm 104 configured to vary a position of the robot blade 106. In some embodiments, the base 102 is configured to control the motion of the transfer arm 104. In some embodiments, the transfer arm 104 may comprise a plurality of sections, 110 and 112. For example, the transfer arm 104 may comprise a first section 110 coupled to the base 102 at a first connection point 110a, and a second section 112 coupled to an end of the first section 110 at a second connection point 112a. The first and second sections, 110 and 112, are configured to rotate about the first and second connection points, 110a and 112a, respectively. In some embodiments, the first and second sections, 110 and 112, may be operated independently of one another, so as to allow for the first section 110 to be rotated in a first direction and the second section 112 to be rotated in a second direction that is different than the first direction.

The robot blade 106 is connected to the transfer arm 104 at a third connection point 106a. The robot blade 106 is configured to receive a substrate 108 (e.g., a semiconductor wafer) and to hold the substrate 108 as the transfer arm 104 moves the robot blade 106 from a first position to a second position. For example, the robot blade 106 may be configured to receive the substrate 108 from a processing tool (e.g., a photoresist spinner) and to hold the substrate 108 as the transfer arm 104 moves the robot blade 106 from the processing tool to a wafer cassette (e.g., a FOUP (Front Opening Unified Pod)), where the substrate 108 is removed from the robot blade 106.

The robot blade 106 is configured to support the substrate 108 in a manner that prevents warpage of the substrate 108 without contacting the entire backside of the substrate 108b. For example, in some embodiments, the robot blade 106 comprises a trench 114 positioned below a portion of the substrate 108. The trench 114 prevents the robot blade 106 from contacting the substrate 108 along an entire backside of the substrate 108b, while still providing support to opposing sides of the substrate 108 to prevent warpage of the substrate 108.

Figure 2:
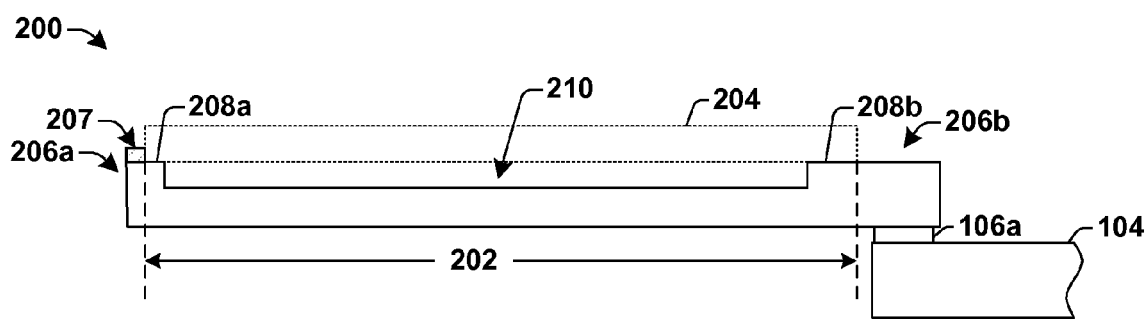
FIG. 2 illustrates a cross-sectional view of some more detailed embodiments of a disclosed robot blade.

FIG. 2 a cross-sectional view of a more detailed embodiment of a disclosed blade 200.

The robot blade 200 comprises a wafer reception area 202 configured to receive a semiconductor wafer 204. In some embodiments, the wafer reception area 202 may comprise an area that has a diameter of approximately 300 mm (to receive a 300 mm wafer). In other embodiments, the wafer reception area 202 may comprise an area that has a diameter of approximately 450 mm (to receive a 450 mm wafer). In yet other embodiments, the wafer reception area 202 may comprise an area that has a diameter less than 300 mm.

A plurality of spatially distinct contact points 208a-208b, configured to contact the semiconductor wafer 204, are located on an exposed surface of the robot blade 200 within the wafer reception area 202. The plurality of contact points 208a-208b are located on contact structures 206a-206b separated by a cavity 210 comprising a negative relief (i.e., a depression) in the exposed surface. The plurality of contact structures 206a-206b protrude above the cavity 210 as positive reliefs, so that the plurality of contact points 208a-208b are configured to contact the semiconductor wafer 204 in a manner that reduces contact with a backside of the semiconductor wafer 204.

In some embodiments, the plurality of contact points 208a-208b are located at positions along a perimeter of the wafer reception area 202. Such positions allow the contact points 208a-208b to provide support to at least two opposing edges of the semiconductor wafer 204. For example, in some embodiments, a second contact point 208b may be located at a side of the robot blade connected to the transfer arm 104, while a first contact point 208a may be located at an opposite side of the robot blade.

The contact structures 206a-206b may comprise any shape. In some embodiments, one or more of the contact structures 206a-206b may comprise a stepped structure having a first step and a second step. A contact point (e.g., contact point 208a) is located on a top surface of the first step. In other embodiments, one or more of the contact structures 206a-206b may comprise substantially vertical sidewalls and have a contact point (e.g., contact point 208b) on a top surface (above the vertical sidewall) of the contact structure(s). In yet other embodiments, one or more of the contact structures 206a-206b may comprise tapered sidewalls with a contact point along the tapered sidewall. It will be appreciated that a disclosed robot blade 200 may comprise different contact structures 206a-206b having varying shapes (e.g., a first contact structure having tapered sidewalls, a second contact structure having a stepped structure, a third contact structure having vertical sidewalls, etc.).

In some embodiments, one or more of the contact structures 206a-206b comprise a stabilizing feature 207 that prevents the semiconductor wafer 204 from moving (e.g., sliding) on the robot blade 200. For example, for a contact structure having a stepped structure with a first step and a second step, the second step comprises a stabilizing feature that acts to prevent the semiconductor wafer 204 from moving. Alternatively, for a contact structure having a tapered sidewall, the taper of the sidewall comprises a stabilizing feature that acts to prevent the semiconductor wafer 204 from moving.

FIGS. 3A-3F illustrates cross-sectional views of various embodiments of disclosed robot blades. It will be appreciated that the cross-sectional views illustrated in FIGS. 3A-3F are not limiting, and that variations and/or combinations of the illustrated cross-sectional views may fall within the disclosed robot blade. For example, in some embodiments, a disclosed robot blade may comprise multiple contact structures having tapered sidewalls.

Figure 3A:
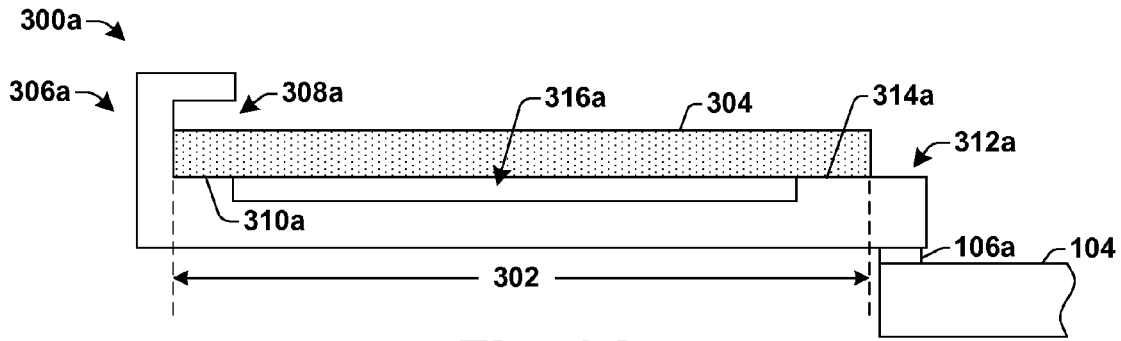
FIGS. 3A-3F illustrates cross-sectional views of various embodiments of disclosed robot blades.

FIG. 3A illustrates some embodiments of a cross-sectional view of a disclosed robot blade 300a. The robot blade 300a comprises a first contact structure 306a having a recess 308a located within a sidewall of the contact structure. The recess 308a opens onto a cavity 316a extending between the first contact structure 306a and a second contact structure 312a. The recess 308a comprises a first contact point 310a located along a bottom surface of the recess 308a. In some embodiments, the second contact structure 312a comprises a second contact point 314a located on a top surface of the second contact structure 312a. A semiconductor wafer 304 is configured to contact the first and second contact points, 310a and 314a, within the wafer reception area 302.

Figure 3B:
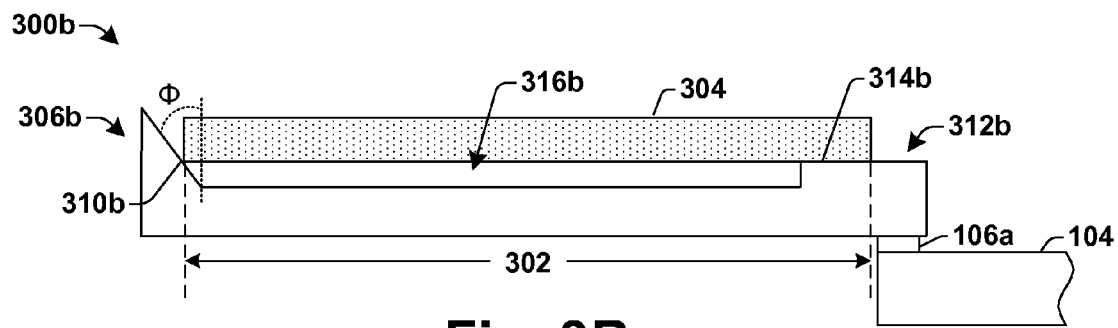

FIG. 3B illustrates some embodiments of a cross-sectional view of a disclosed robot blade 300b. The robot blade 300b comprises a first contact structure 306b having a tapered sidewall. The tapered sidewall may have an angle Φ of between 0° and 90°, non-inclusive. In some embodiments, the tapered sidewall may have an angle that is in a range of between approximately 30° and approximately 60°. The tapered sidewall comprises a first contact point 310b. Since the tapered sidewall has an angle that is less than 90°, a semiconductor wafer 304 will contact the tapered sidewall at a single corner of the semiconductor wafer 304b, thereby reducing contact with a backside of a semiconductor wafer 304b and holding the semiconductor wafer 304b in a fixed position. A cavity 316b extends between the first contact structure 306b and a second contact structure 312b. In some embodiments, the second contact structure 312b comprises a second contact point 314b located on a top surface of the second contact structure 312b. A semiconductor wafer 304 is configured to contact the first and second contact points, 310b and 314b, within the wafer reception area 302.

Figure 3C:
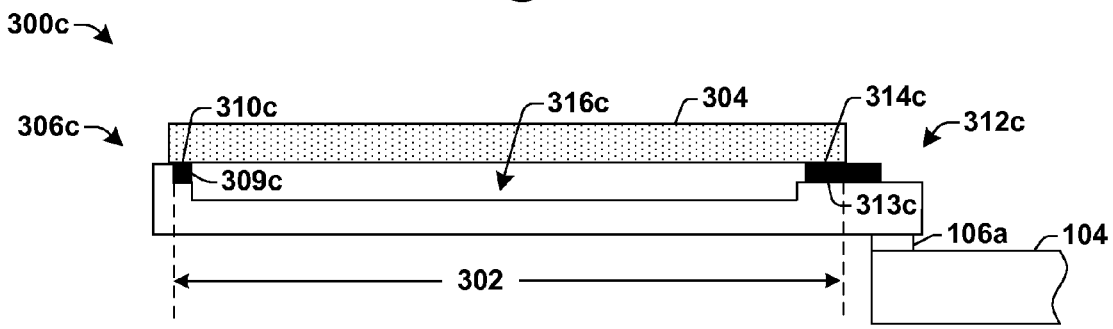

FIG. 3C illustrates some embodiments of a cross-sectional view of a disclosed robot blade 300c. The robot blade 300c comprises a first contact structure 306c and a second contact structure 312c separated by a cavity 316c. The first contact structure 306c comprises a stepped structure having a first step and a second step. A first buffer layer 309c is positioned on a top surface of the first step. The first buffer layer 309c comprises a first contact point 310c. A second buffer layer 313c is positioned on a top surface of the second contact structure 312c. The second buffer layer 313c comprises a second contact point 314c. The first and/or second buffer layers, 309c and/or 313c, have a high coefficient of friction (e.g., a coefficient of friction that is large than that of an underlying metal of the robot blade 300c) that mitigates movement of a semiconductor wafer in contact with the buffer layer. In some embodiments, the buffer layer 309c and/or 313c may comprise a polymer (e.g., rubber) or a sponge, for example. A semiconductor wafer 304 is configured to contact the first and second contact points, 310c and 314c, within the wafer reception area 302.

Figure 3D:
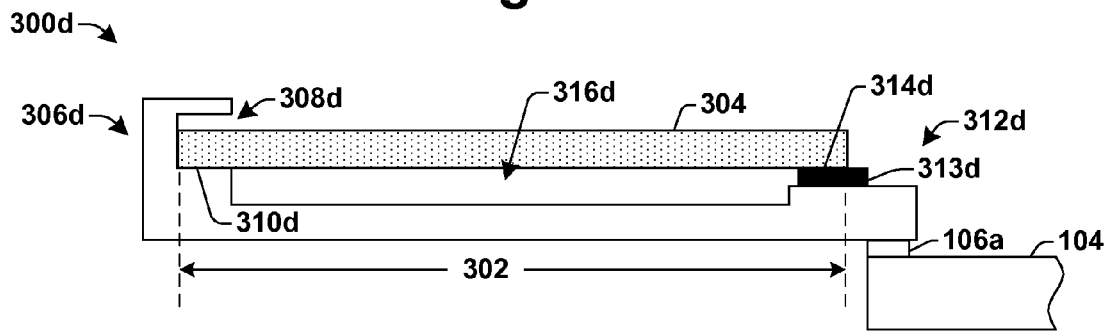

FIG. 3D illustrates some embodiments of a cross-sectional view of a disclosed robot blade 300d. The robot blade 300d comprises a first contact structure 306d having a recess 308d located within a sidewall of the first contact structure 306d. The second contact structure 312d comprises a buffer layer 313d, comprising a second contact point, positioned on a top surface of the second contact structure 312d. A semiconductor wafer 304 is configured to contact the first and second contact points, 310d and 314d, within the wafer reception area 302.

Figure 3E:
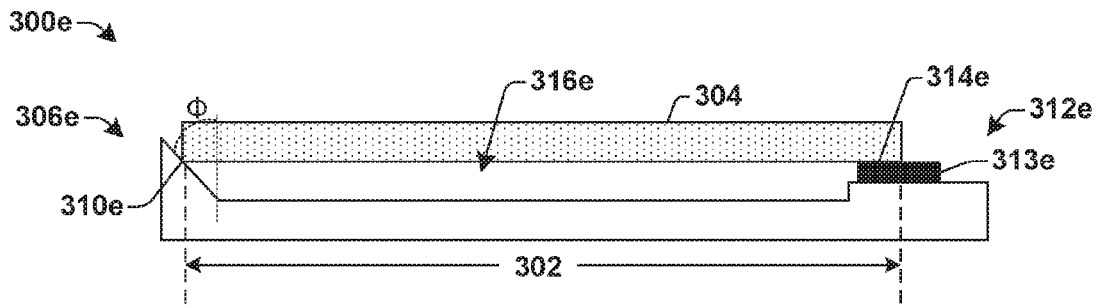

FIG. 3E illustrates some embodiments of a cross-sectional view of a disclosed robot blade 300e. The robot blade 300e comprises a first contact structure 306e and a second contact structure 312e separated by a cavity 316e. The first contact structure 306e has a tapered sidewall having an angle Φ of between 0° and 90°, non-inclusive. A buffer layer 313e, comprising a second contact point 314e, is positioned on a top surface of the second contact structure 312e. A semiconductor wafer 304 is configured to contact the first and second contact points, 310e and 314e, within the wafer reception area 302.

Figure 3F:
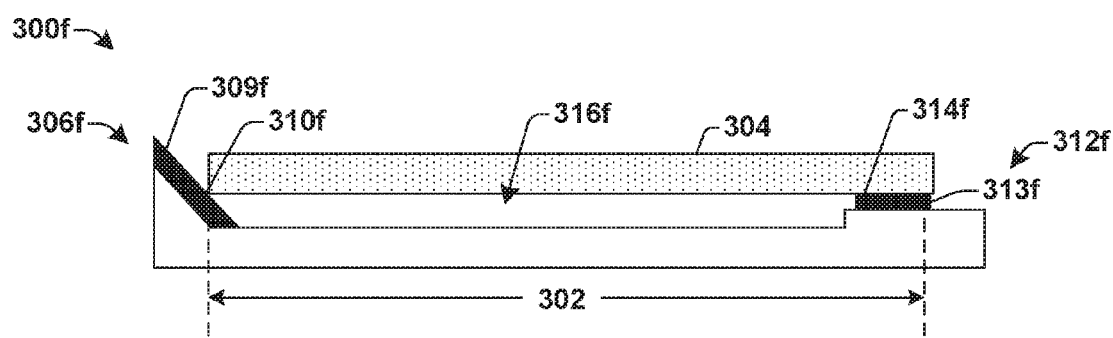

FIG. 3F illustrates some embodiments of a cross-sectional view of a disclosed robot blade 300f. The robot blade 300f comprises a first contact structure 306f and a second contact structure 312f separated by a cavity 316f. The first contact structure 306f has a tapered sidewall. A first buffer layer 309f is positioned on the tapered sidewall. The first buffer layer 309f comprises a first contact point 310f. A second buffer layer 313f is positioned on a top surface of the second contact structure 312f. The second buffer layer 313f comprises a second contact point 314f. A semiconductor wafer 304 is configured to contact the first and second contact points, 310f and 314f, within the wafer reception area 302.

Figures 4A, 4B:
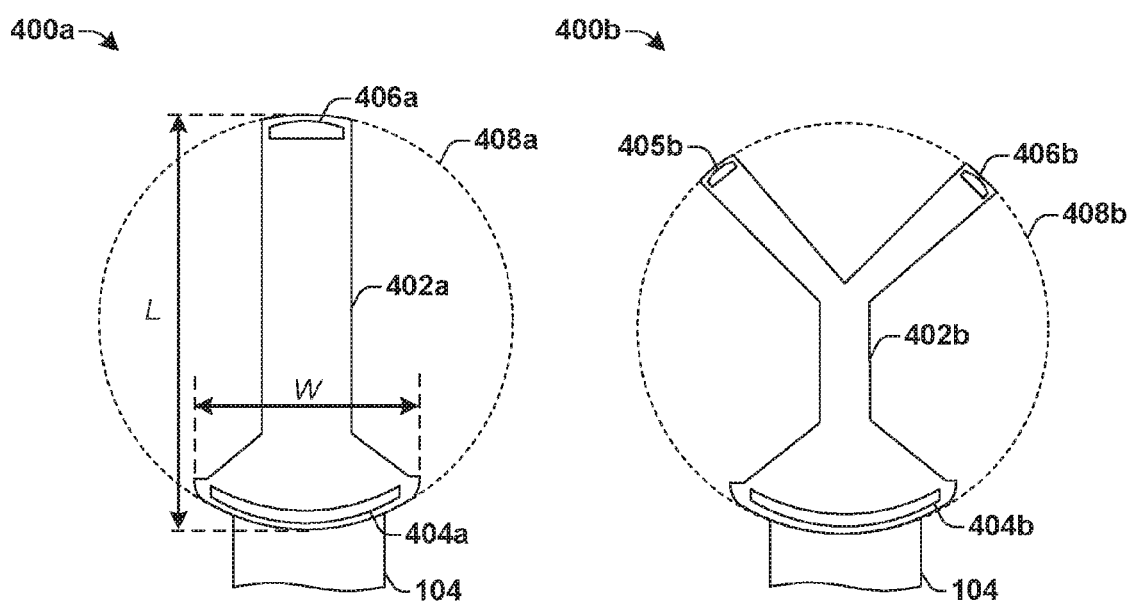
FIGS. 4A-4B illustrates top-views of various embodiments of disclosed robot blades.

FIGS. 4A-4B illustrates top-views of various embodiments of disclosed robot blades. It will be appreciated that the top-views illustrated in FIGS. 4A-4B are not limiting, and that variations or combinations of the illustrated top-views may fall within the disclosed robot blade. For example, although the illustrated top views of FIGS. 4A-4B comprise robot blades having two or three contact points, the disclosed robot blade may comprise any number of contact points (e.g., 3 or more contact points). Similarly, although the illustrated top-views of FIGS. 4A-4B comprise robot blades having a length that is greater than an associated width, in other embodiments, the width of the robot blade may be substantially equal to the length of the robot blade.

FIG. 4A illustrates a top-view 400a of some embodiments of a disclosed robot blade 402a.

The robot blade 402a extends outward from an attached transfer arm 104 along a length L. The length L is greater than or equal to a diameter of a semiconductor wafer 408a to be received. The disclosed robot blade 402a has a width W (perpendicular to the length L) that is smaller than the length L. In some embodiments, the width W of the robot blade 402a may vary over the length L. For example, in some embodiments, the robot blade 402a may taper to a greater width along the perimeter of the wafer reception area (e.g., so that robot blade 402a has a larger width at a perimeter than at an interior of the robot blade 402a) to provide for greater support to an overlying semiconductor wafer 408a.

The robot blade 402a extends along an axis running through a center of a wafer and comprises a first contact point 404a and second contact point 406a. The first contact point 404a is located at a first side of the robot blade 402a. The second contact point 406a is located at a second side of the robot blade 402a, opposite the first side. A cavity (i.e., an area lower than the first and second contact points, 404a and 406a) extends along the length of the robot blade between the first contact point 404a and the second contact point 406a. In some embodiments, the first contact point 404a may be larger than the second contact point 406a, or vice versa.

FIG. 4B illustrates top-view 400b of some embodiments of a disclosed robot blade 402b having a Y shape.

The robot blade 402b comprises a first contact point 404b, a second contact point 405b, and a third contact point 406b. The first contact point 404b is located at a first side of the robot blade 402b. The second and third contact points, 405b and 406b, are located at a second side of the robot blade 402b, opposite the first side. A cavity (i.e., an area lower than the first, second, and third contact points, 404b, 405b, and 406b) extends along the length of the robot blade between the first contact point 404b and the second and third contact points, 405b and 406b.

Figure 5:
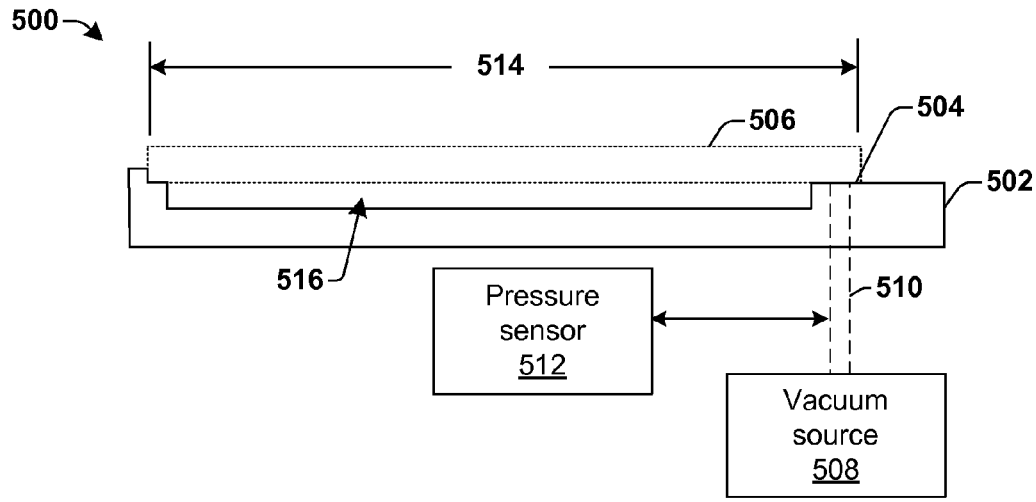
FIG. 5 illustrates a block diagram of some embodiments of a wafer transfer robot having a vacuum sensor configured to determine the presence of a semiconductor wafer on a disclosed robot blade.

FIG. 5 illustrates a block diagram of some embodiments of a wafer transfer robot 500 having a pressure sensor 512 configured to determine the presence of a semiconductor wafer on a disclosed robot blade 502.

The robot blade 502 is in communication with a vacuum source 508 configured to form a vacuum, having a lower number of particles per unit than a surrounding ambient environment, along a backside of a semiconductor wafer 506. In some embodiments, the vacuum may be formed within a tube 510 extending between the vacuum source 508 and a contact point 504 of the robot blade 502. In other embodiments, the vacuum may be formed within a cavity in the robot blade 502 underlying the semiconductor wafer 506. In some embodiments, to prevent warpage of the semiconductor wafer 506, the vacuum source 508 is configured to generate a weak vacuum that is unable to affix the semiconductor wafer 506 to a wafer reception area 514 of the robot blade 502

The pressure sensor 512 is configured to measure a value of a pressure of the vacuum and based upon the measured pressure of the vacuum to determine whether the semiconductor wafer 506 is in a wafer reception area 514. In some embodiments, the measured pressure of the vacuum may be compared to a predetermined threshold value that is indicative of whether the semiconductor wafer 506 is in the wafer reception area 514. For example, if a measured pressure of the vacuum is greater than the threshold value the semiconductor wafer 506 is not in the wafer reception area 514, while if a measured pressure of the vacuum is less than or equal to the threshold value the semiconductor wafer 506 is in the wafer reception area 514.

Figure 6:
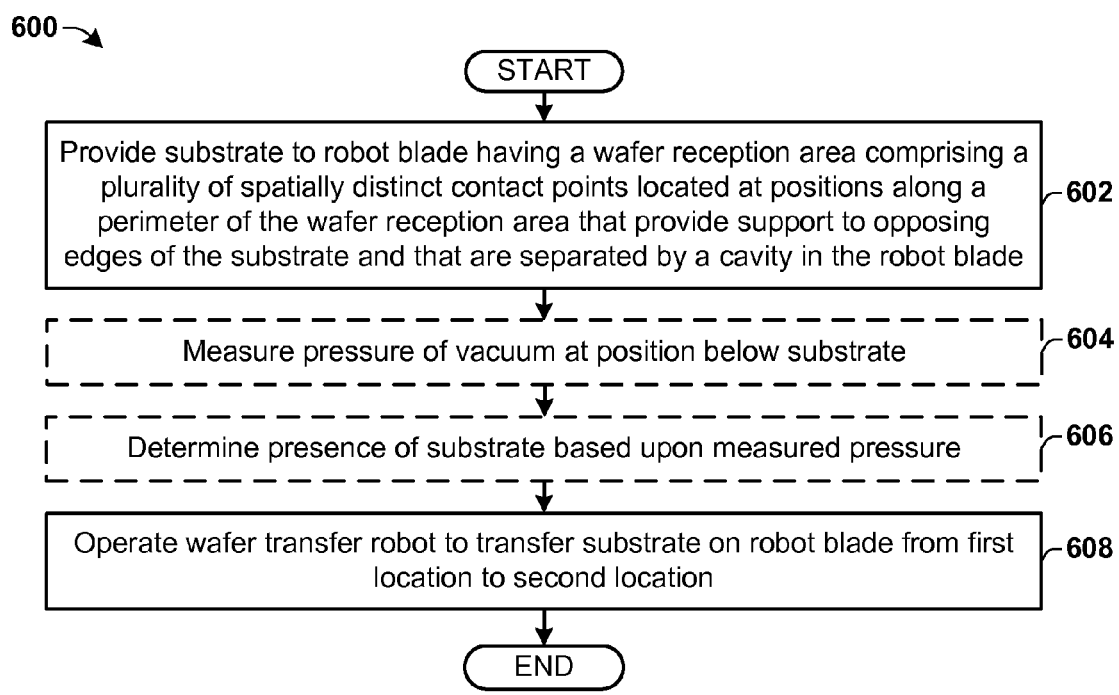
FIG. 6 illustrates a flow chart of some embodiments of a method of transferring a semiconductor substrate from a first location to a second location using a wafer transfer robot having a disclosed robot blade.

FIG. 6 illustrates a flow chart of some embodiments of a method 600 of transferring a semiconductor substrate from a first location to a second location using a wafer transfer robot.

While the disclosed method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a substrate is provided to a robot blade having a wafer reception area configured to receive the substrate. The wafer reception area comprises a plurality of spatially distinct contact points, configured to contact the substrate, which are located at positions along a perimeter of the wafer reception area. One or more trenches extend as depressions between the plurality of spatially distinct contact points.

At 604, a pressure of a vacuum located at a position below the substrate may be measured.

At 606, a presence of the substrate may be determined based upon measured pressure of the vacuum. For example, the measured pressure of the vacuum may be compared to a predetermined threshold value that is indicative of whether the substrate is in the wafer reception area. If a measured pressure of the vacuum is greater than the threshold value the semiconductor wafer is not in the wafer reception area, while if the measured pressure of the vacuum is less than or equal to the threshold value the semiconductor wafer is in the wafer reception area.

At 608, a wafer transfer robot is operated to transfer a substrate on the robot blade from a first location (e.g., a processing tool) to a second location (e.g., a wafer cassette).

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a wafer transfer robot having a robot blade that can be used to handle substrates that are patterned on both sides without causing warpage of the substrates.

In some embodiments, the present disclosure relates to a wafer transfer robot. The wafer transfer robot comprises a robot blade comprising a wafer reception area configured to receive a substrate, wherein the wafer reception area comprises a plurality of spatially distinct contact points, located at positions along a perimeter of the wafer reception area, which provide support to opposing edges of the substrate and that are separated by a cavity in the robot blade. The wafer transfer robot further comprises a transfer arm connected to the robot blade at a first connection point and configured to vary a position of the robot blade.

In other embodiments, the present disclosure relates to a robot blade for a wafer transfer robot. The robot blade comprises a wafer reception area configured to receive a semiconductor wafer. The robot blade further comprises a plurality of contact structures comprising contact points disposed at positions along a perimeter of the wafer reception area that provide support to opposing edges of the semiconductor wafer. The robot blade further comprises one or more stabilizing features located on one or more of the plurality of contact structures, wherein the one or more stabilizing features prevent the semiconductor wafer from moving on the robot blade. The robot blade further comprises a cavity comprising a negative relief located between two or more of the plurality of plurality of contact structures. The cavity allows for the semiconductor wafer to be received in the wafer reception area, while minimizing contact with a backside of the semiconductor wafer.

In other embodiments, the present disclosure relates to a method of transferring a substrate. The method comprises providing a substrate to a robot blade comprising a wafer reception area, wherein the wafer reception area comprises a plurality of spatially distinct contact points located at positions along a perimeter of the wafer reception area that provide support to opposing edges of the substrate and that are separated by a cavity in the robot blade. The method further comprises operating a wafer transfer robot to transfer the substrate on the robot blade from a first location to a second location.

What is claimed is:

1. A wafer transfer robot, comprising
   a robot blade comprising a wafer reception area configured to receive a substrate, wherein the wafer reception area comprises a plurality of contact structures located at positions along a perimeter of the wafer reception area, which have a plurality of contact points configured to contact the substrate and provide support to opposing edges of the substrate and that are separated by a cavity in the robot blade;
   a transfer arm connected to the robot blade at a first connection point and configured to vary a position of the robot blade;
   wherein one or more of the plurality of contact structures have a tapered sidewall comprising a first one of the plurality of contact points; and
   wherein one or more of the plurality of contact structures comprise a stepped structure having a first step with a horizontal surface comprising a second one of the plurality of contact points.

2. The wafer transfer robot of claim 1, wherein the plurality of contact points are located on a plurality of contact structures that protrude above the cavity as positive reliefs, so that the plurality of contact points are configured to contact the substrate and the cavity does not.

3. The wafer transfer robot of claim 1, wherein tapered sidewall has an angle that is in a range of between approximately 30° and approximately 60°.

4. The wafer transfer robot of claim 1, wherein the robot blade has a length, extending in a direction outward from the transfer arm, which is greater than or equal to a length of the substrate to be received.

5. The wafer transfer robot of claim 1, wherein one or more of the plurality of contact points are disposed on a buffer layer comprising a polymer.

6. The wafer transfer robot of claim 1, further comprising:
   a first buffer layer arranged on the horizontal surface.

7. The wafer transfer robot of claim 6, wherein the first buffer layer is laterally set back from the cavity by a non-zero distance.

8. The wafer transfer robot of claim 6, further comprising:
   a second buffer layer arranged on a tapered sidewall of the cavity and extending from a lower surface of the cavity to a height.

9. The wafer transfer robot of claim 8, wherein the first buffer layer and the second buffer layer comprise sponges.

10. The wafer transfer robot of claim 1, wherein the tapered sidewall extends from within the cavity to a location that is at a height that is vertically over the first one of the plurality of contact points.

11. A robot blade for a wafer transfer robot, comprising:
    a wafer reception area configured to receive a semiconductor wafer;

a plurality of spatially distinct contact structures, respectively comprising one or more contact points disposed at positions along a perimeter of the wafer reception area and configured to provide support to outer edges of the semiconductor wafer;

a cavity comprising a negative relief separating two or more of the plurality of spatially distinct contact structures;

wherein one or more of the plurality of spatially distinct contact structures comprise an angled sidewall having a constant slope, which is directly connected to both a horizontal surface and a vertical surface, and wherein one or more of the contact points are arranged along the angled sidewall; and wherein one or more of plurality of contact structures comprise a stepped structure having a first step having a horizontal surface, wherein a first contact point is located on the horizontal surface of the first step.

12. The robot blade of claim 11, wherein one or more of plurality of contact structures have a tapered sidewall extending from a lower surface of the cavity to a height and comprising a second contact point.

13. The robot blade of claim 11, wherein at least one of the one or more contact points is located along a sidewall of the cavity.

14. The robot blade of claim 11, wherein the vertical surface is connected to a second horizontal surface arranged along a bottom of the robot blade.

15. The robot blade of claim 11, wherein the angled sidewall has an angle that is in a range of between approximately 30° and approximately 60°.

16. The robot blade of claim 11, wherein the one or more contact points are disposed on a buffer layer comprising a polymer.

17. A robot blade for a wafer transfer robot, comprising:

a wafer reception area arranged over an upper surface of a wafer blade and configured to receive a semiconductor wafer;

a first contact point located along a tapered sidewall of a first contact structure, wherein the tapered sidewall is directly connected to a first horizontal surface and a vertical surface, wherein the vertical surface is further connected to a second horizontal surface arranged along a bottom of the wafer blade;

a second contact point located on a second contact structure that protrudes outward from the first horizontal surface;

a transfer arm connected to the wafer blade at a first connection point and configured to vary a position of the wafer blade; and wherein the second contact point is located on a third horizontal surface arranged along an upper surface of the second contact structure.

18. The wafer transfer robot of claim 17, wherein the first contact structure and the second contact structure are distinct protrusions that are spatially separated from one another.

19. The wafer transfer robot of claim 17, further comprising:

a first buffer layer arranged over the tapered sidewall and extending from the upper surface of the wafer blade to a location vertically over the first contact point; and a second buffer layer arranged on the upper surface of the second contact structure.

20. The wafer transfer robot of claim 17, wherein the vertical surface is located at an end of the wafer blade.

* * * * *